US009269723B2

(12) United States Patent
Bellaiche

(10) Patent No.: US 9,269,723 B2
(45) Date of Patent: Feb. 23, 2016

(54) PRINTING ELECTRONIC CIRCUITRY LOGIC

(71) Applicant: Gil Bellaiche, Herzlyia (IL)

(72) Inventor: Gil Bellaiche, Herzlyia (IL)

(73) Assignee: EASTMAN KODAK COMPANY, Rochester, NY (US)

( * ) Notice: Subject to any disclaimer, the term of this patent is extended or adjusted under 35 U.S.C. 154(b) by 49 days.

(21) Appl. No.: 14/248,374

(22) Filed: Apr. 9, 2014

(65) Prior Publication Data

US 2015/0294982 A1  Oct. 15, 2015

(51) Int. Cl.
*H01L 21/00* (2006.01)
*H01L 27/118* (2006.01)
*H01L 21/768* (2006.01)

(52) U.S. Cl.
CPC .... *H01L 27/11803* (2013.01); *H01L 21/76895* (2013.01)

(58) Field of Classification Search
CPC ......... H01L 24/03; H01L 24/05; H01L 24/45; H01L 24/48; H01L 27/11803; H01L 27/76895
See application file for complete search history.

(56) References Cited

U.S. PATENT DOCUMENTS

| 7,903,428 B2 | 3/2011 | Liu et al. |
| 2002/0179991 A1* | 12/2002 | Varrot et al. ................... 257/459 |
| 2008/0315191 A1* | 12/2008 | Hashizume et al. ............ 257/40 |

* cited by examiner

*Primary Examiner* — Richard Booth
(74) *Attorney, Agent, or Firm* — Nelson A. Blish; William R Zimmerli

(57) ABSTRACT

A method of making a logic gate array includes providing a substrate; forming an array of first conductive lines with plurality of first pads disposed on each of the first conductive lines on the substrate wherein the array of first conductive lines is disposed in a first direction; forming an array of isolation lines over the first conductive lines wherein the isolation lines are not disposed on the first pads; forming an array of second conductive lines with plurality of second pads disposed on each of the second conductive lines on the substrate wherein the array of second conductive lines is disposed in a second direction and wherein orientation of the second direction is different than the orientation of the first direction; and printing one or more conductive ink dots at least one intersection of the first conductive lines and the second conductive lines by connecting the corresponding first pads and corresponding second pads.

13 Claims, 8 Drawing Sheets

PRINTING ELECTRONIC CIRCUITRY LOGIC

CROSS REFERENCE TO RELATED APPLICATIONS

Reference is made to commonly-assigned copending U.S. patent application Ser. No. 14/248,378, filed Apr. 9, 2014, entitled LOGIC GATE ARRAY, by Bellaiche; the disclosure of which is incorporated herein.

FIELD OF THE INVENTION

The present invention relates to methods and apparatus for printing electronic circuitry by deposition of conductive ink on a substrate.

BACKGROUND OF THE INVENTION

Most of the electronic circuits includes a bare-board and electronic devices. Generally the bare-board includes more than two layers and is fabricated by a printed circuit board (PCB) manufacturer. Many different devices are collected and assembled on that bare-board. Boolean logic circuits such as the AND, OR, NOT, NAND, NOR, XOR, NOR2 gates are well known and are used for implementing digital circuits in such as PCB logic.

U.S. Pat. No. 7,903,428 (Liu et al.) discloses an intra-connection layout for an array. An alterable area is disposed between the devices of a device array. The alterable area includes an insulation layer, a group of conductive wires and another group of conductive wires. The first conductive wires are disposed within the alterable area along a first direction for selectively connecting electrical paths in the first direction between different devices. The second conductive wires are disposed within the alterable area along a second direction for selectively connecting electrical paths in the second direction between different devices. The insulation layer is disposed within the alterable area and between the above-mentioned first conductive wires and second conductive wires, wherein the insulation layer has an opening to allow one of the first conductive wires and one of the second conductive wires to be contacted with each other.

U.S. Pat. No. 7,903,428 discloses openings 217, 218 in the insulation layer which are formulated according to the design of the circuit. Moreover, the second conductive wires are disposed over the insulation layer on previously exposed openings to comply with a specific design. It appears that the openings 217, 218 are made by cutting off parts of the previously disposed insulation layer. The conductive wires are printed with plurality of pads and the insulation bands are printed on the paths before the second conductive wires are printed.

In U.S. Pat. No. 7,903,428, the openings 217, 218 are formed in the insulation layer. It would be desirable to provide a matrix wherein there is no need to cut off openings in the insulation layer.

SUMMARY OF THE INVENTION

The present invention is for an improved method of printing an electrical matrix. The matrix includes vertical conductive lines with pads in one layer and a second layer which includes horizontal conductive lines with pads. Isolation paths are printed on top of the horizontal lines prior to vertical lines deposition. The vertical lines are connected to logical gates such as NOR gates, and the horizontal lines are connected to various electrical signals.

In the present invention a matrix is provided without any relation to a specific design of a logical circuit and as such it is not dependent on the structure of the disposed conductive lines and nor the disposal of the insulation bands. The digital logic is provided in a later stage by filling conductive ink between selected pads of a vertical conductive wire and a pad of a horizontal conductive line.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

While the present invention is described in connection with one of the embodiments, it will be understood that it is not intended to limit the invention to this embodiment. On the contrary, it is intended to cover alternatives, modifications, and equivalents as covered by the appended claims.

Figure 1A:
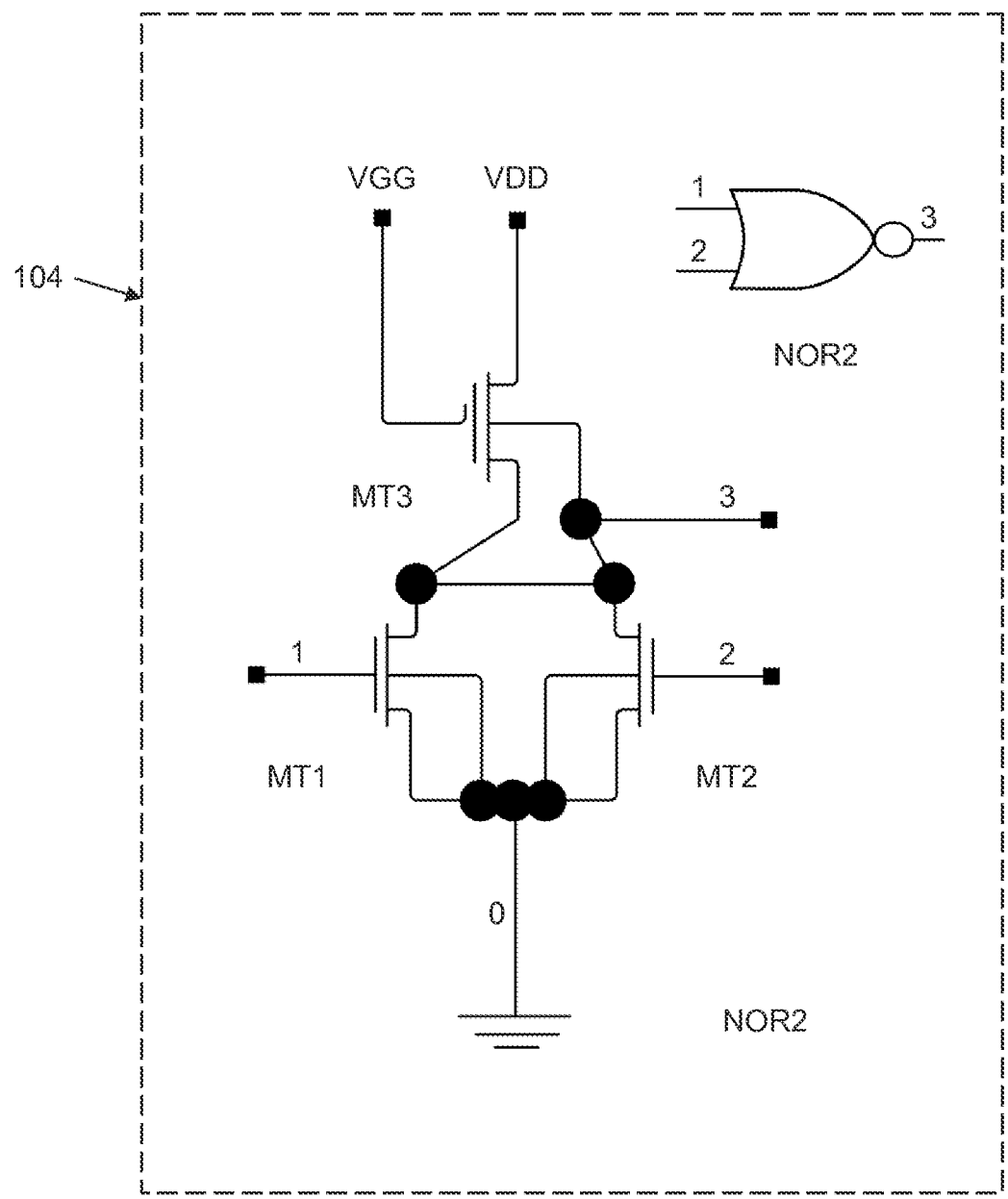
FIG. 1A represents in diagrammatic form a NOR2 logic design implemented with three transistors.

The essence of the present invention is to print simple electronic printing circuit boards. Those boards will be built on atomic building blocks. The atomic elements are implemented from plurality of two input NOR gates (NOR2). Almost every logic circuitry may be implemented by using NOR gates, NOR2 gates are made from three transistors. Transistors can be printed for example by using Kodak Spatial Atomic Layer Deposition (SALD) technology. FIG. 1A shows an atomic element 104 of NOR2 gate logic design implemented by three transistors (MT1, MT2, MT3).

Figure 1B:
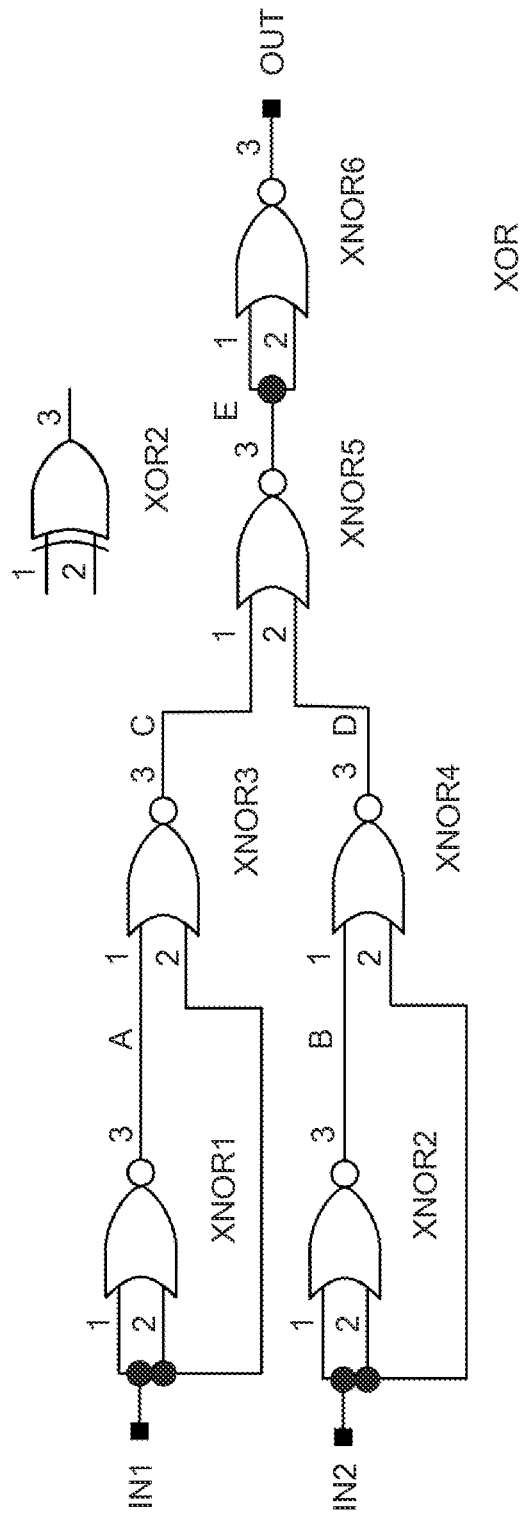
FIG. 1B represents in diagrammatic form a XOR gate implementation using six NOR2 gates.
Figure 1C:
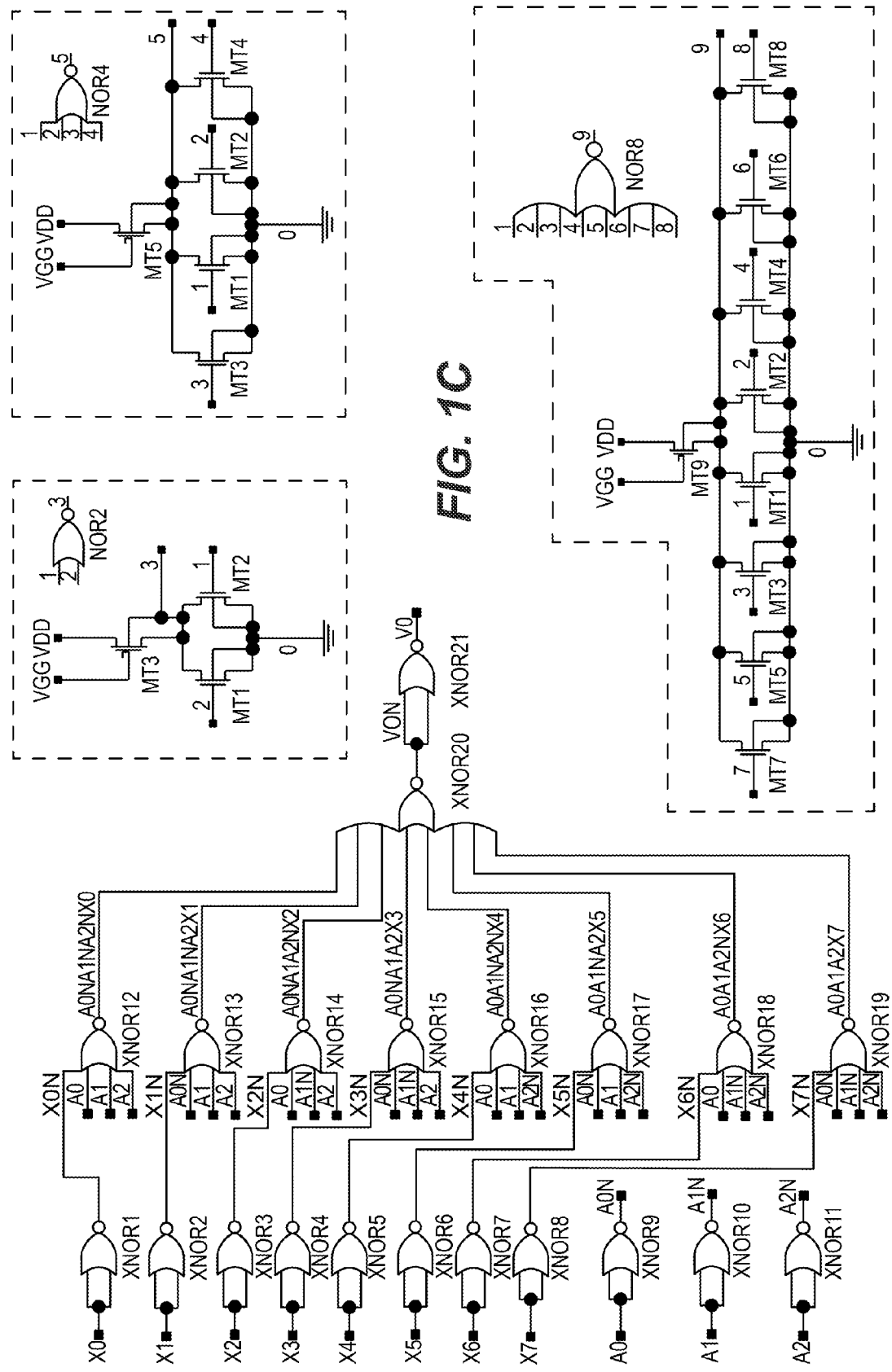
FIG. 1C represents in diagrammatic form of a multiplexer implementation.
Figure 1D:
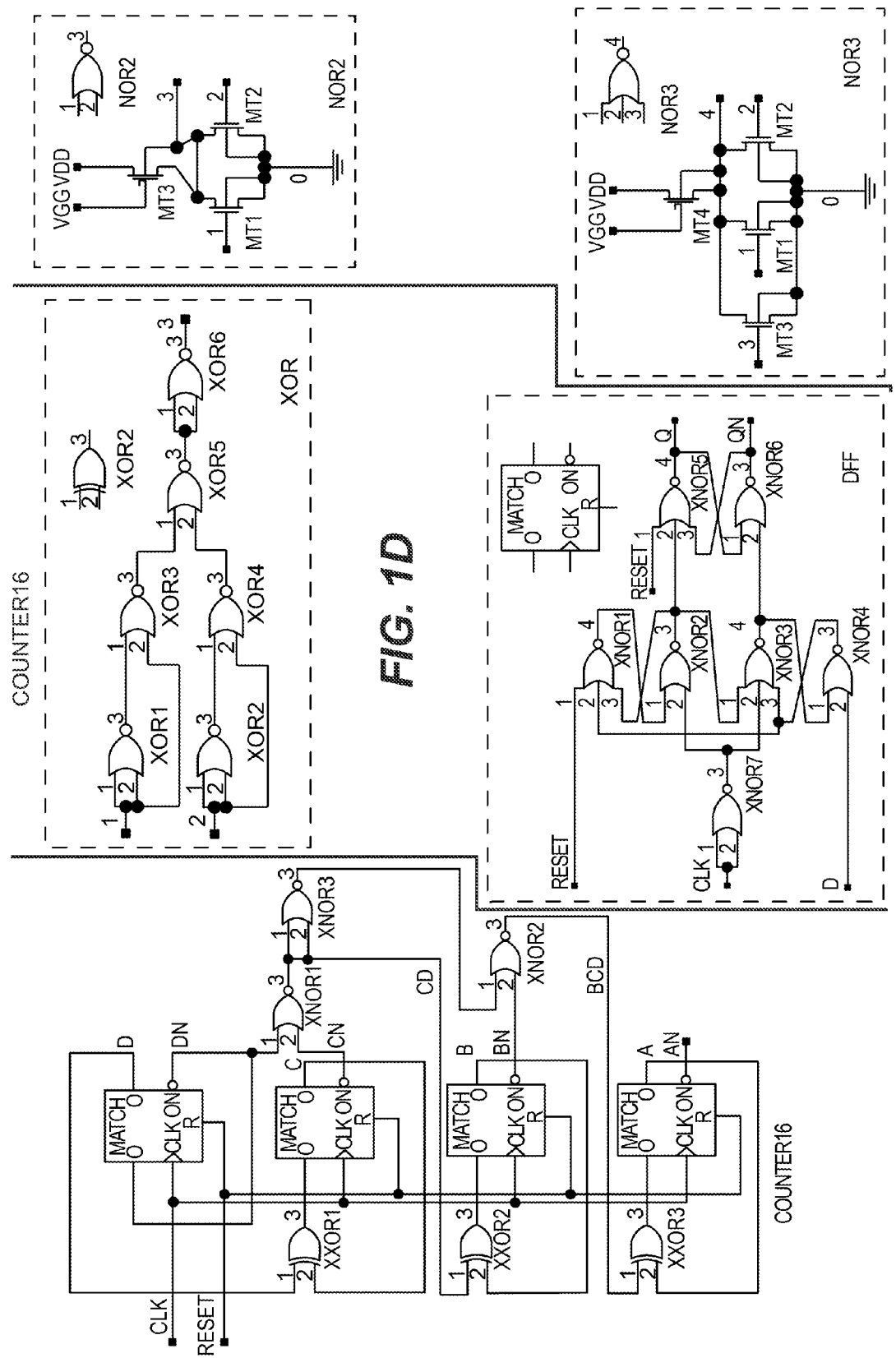
FIG. 1D represents in diagrammatic form of a 4 bit counter implementation.

FIG. 1B shows a XOR gate implemented by two atomic NOR2 elements XNOR1 and XNOR2. FIG. 1C and FIG. 1D present few examples of logic circuitry implemented solely by NOR gates. FIG. 1C shows a multiplexer and FIG. 1D a 4-bit counter.

Atomic elements can be implemented also by using other gates than NOR2 gates, for example NOR3 (3 input NOR gate), NAND2 (2 input NAND), NAND3 (3 input NAND), or other.

Figure 2:
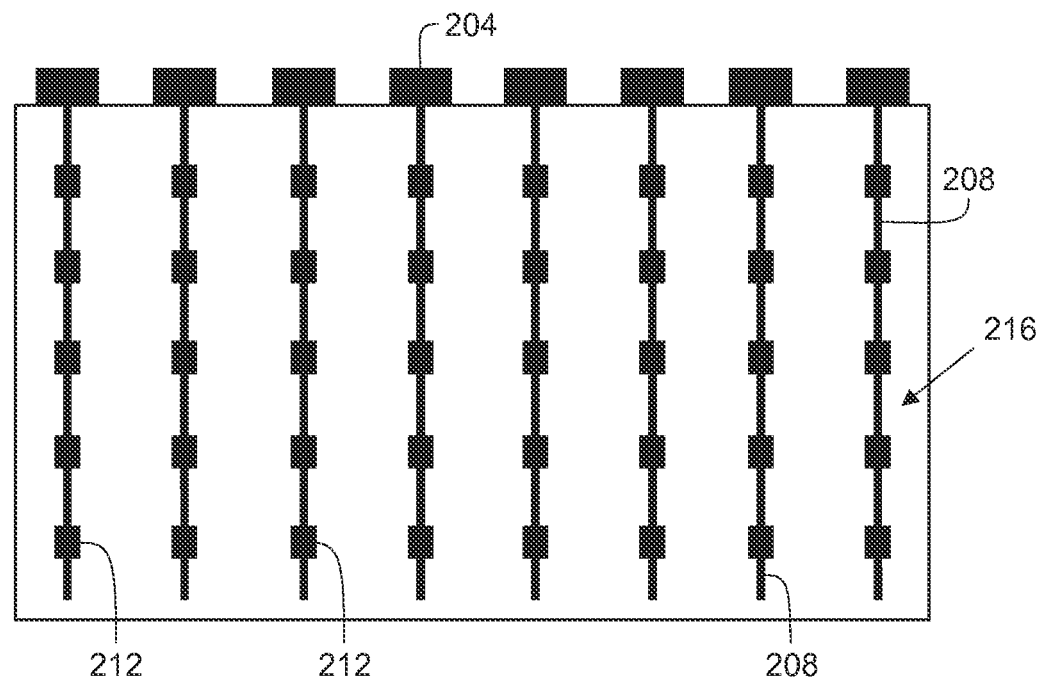
FIG. 2 shows vertical conductive lines deposition with pads.

A connection matrix 404 (shown in FIG. 4) is created using electronic connection between atomic elements 104. The connection matrix 404 is made by aligning conductive lines printed on a substrate 408 along horizontally along the X axis and vertically along the Y axis. FIG. 2 shows vertical conductive lines 208 printed on an insulator layer 216 (on substrate 408). The conductive lines 208 are printed with plurality of pads 212. Each of the conductive lines 208 are connected at the end of the lines to connection 204, a connection to atomic elements 104. The number of active vertical lines '208 lines' required is equal to the number of the atomic elements input/output lines times the number of the atomic elements required. For NOR2 atomic elements three '208 lines' are required for each NOR2 element. Each atomic element is also equipped which pins for connection to external power VDD and VGG.

Figure 3:
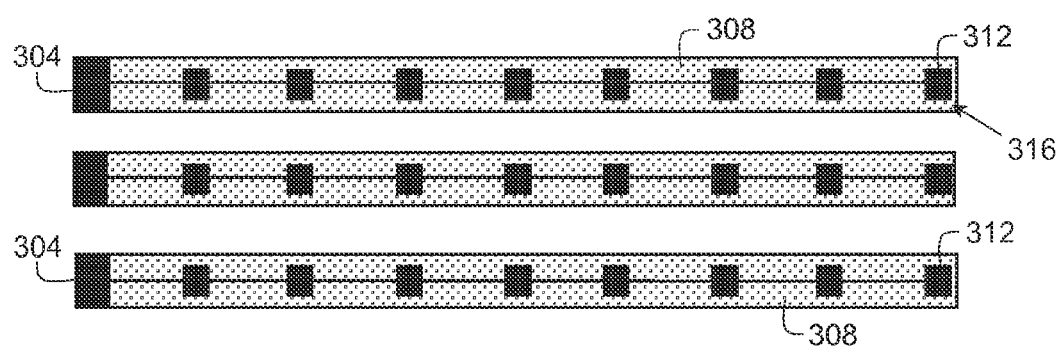
FIG. 3 shows horizontal conductive lines deposition with pads.

FIG. 3 shows horizontal conductive lines 308 in the X axis. Each horizontal line 308 represents an internal or an external signal line which is implemented in an electronic logical circuit. The conductive lines 308 are printed with plurality of pads 312. Each horizontal line 308 is equipped with a connection pad 304. Connection 304 pads are used for usually connecting to external signals and internal signals if required. The horizontal lines 308 layer is separated from the vertical lines layer 208 by an insulator bands 316, thus creating a general connection matrix 404.

Figure 4:
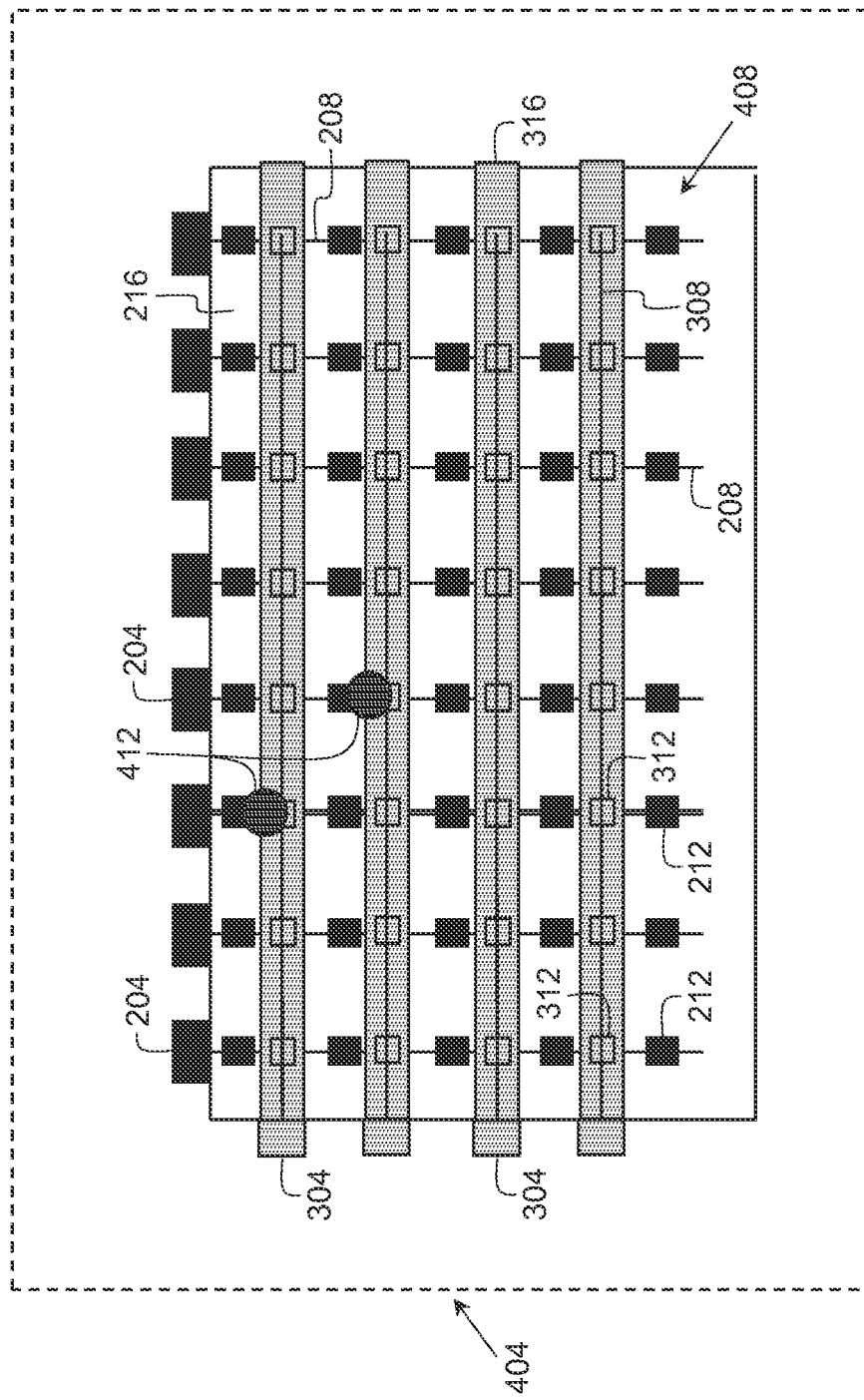
FIG. 4 shows a connection matrix of horizontal and vertical lines.

FIG. 4 shows a created connection matrix 404 with a grid of vertical and horizontal conductive lines superposed on each other and separated by insulator band 316. Horizontal pads 312 are positioned on bottom of vertical pads 212. In order to get a connection between signal 304 to an atomic element connection 204, it is required to connect appropriate vertical line 208 to a horizontal line 308 by imprinting a conductive material into the intersection of appropriate horizontal pad 312 and vertical pad 212. The conductive ink 412 is imprinted in the pads intersection to enable the electronic connection between specific horizontal and vertical lines by means of inkjet for example.

Figure 5:
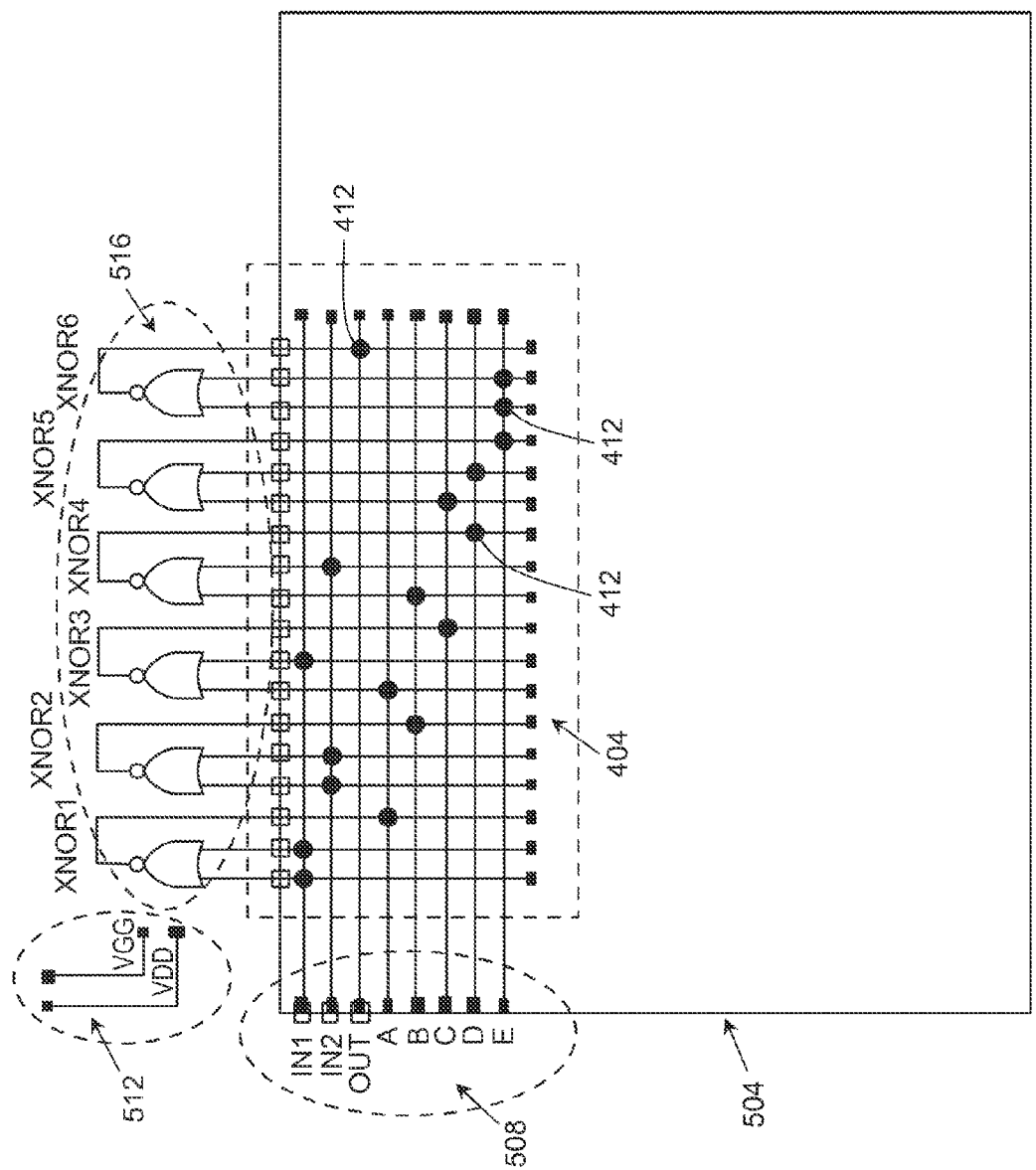
FIG. 5 shows an electronic implementation of a XOR gate (shown in FIG. 1B) using connection matrix.

FIG. 5 shows an implementation of XOR gate 504 by using a connection matrix 404. The external (IN1, IN2, OUT) and internal (A, B, C, D, E) signal ports 508 are connected to horizontal conductive lines 308 whereas the atomic NOR2 elements (XNOR1-XNOR6) 516 are connected the vertical conductive lines 208. The circuit is operated by power supplied from power supply ports 512. The horizontal and vertical lines are connected by the imprinted conductive dots 412 in the intersection between pairs of appropriate vertical and horizontal lines to form the required logical circuit, in this case a XOR gate implementation.

In summary, the atomic elements 104 and generic conductive lines grid 404 is printed on a substrate 408 by means of high-end printing plants capable of printing electronic transistors, in a process such as SALD. The atomic elements 104 are connected to vertical conductive lines 208 containing pads 212. An isolation layer 316 is printed on previously printed layer. Horizontal conductive lines 308 with pads 312 are deposited on isolation layer 316. Now in order to formulate the logic circuit conductive ink dots are printed at the intersection of pairs of signal connection 508 and atomic element connection 204. The printed dots 412 should be large enough to cover appropriate pad 212 and 312 and the isolated areas between them.

The order of deposition is not essential, the vertical lines can be deposited in a first layer followed by insulator bands printed on them, whereas the horizontal lines will be printed on top of the vertical lines separated by insulation bands. In addition the atomic elements can be attached to the horizontal lines and the signals to the vertical lines. The direction of the vertical lines will be essentially perpendicular to the horizontal lines.

The present invention prints simple electronic printing circuit boards. Those boards are built on building blocks from a plurality of two input NOR gates (NOR2). Almost every logic circuit can be implemented by using NOR gates. NOR2 gates are made from three transistors which can be printed for example by using atomic layer deposition (ALD) technology. A connection matrix is created using electronic connection between atomic elements by aligning conductive lines printed on a substrate along horizontally along the X axis and vertically along the Y axis. The elements and generic conductive lines grid are printed on a substrate in a process such as ALD and are connected to vertical conductive lines containing pads. An isolation layer is printed on a previously printed layer. Horizontal conductive lines with pads are deposited on an isolation layer. In order to formulate the logic circuit conductive ink dots are printed at the intersection of pairs of signal connection and atomic element connection. The printed dots should be large enough to cover the appropriate pad and the isolated areas between them.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

PARTS LIST 104 atomic element
204 connection to atomic element
208 vertical conductive lines (Y lines)
212 pads on vertical conductive lines
216 insulator plane
304 connections to signal
308 horizontal conductive lines (X lines)
312 conductive pads for horizontal conductive lines
316 insulator band
404 connection matrix
408 substrate
412 conductive ink imprinted in pad intersection
504 XOR gate implemented using a connection matrix
508 external and internal signal ports connected to horizontal lines
512 power supply ports
516 atomic elements array connected to vertical conductive lines

The invention claimed is:

1. A method of making a logic gate array, comprising:
providing a substrate;
forming an array of first conductive lines with a plurality of first pads disposed on each of the first conductive lines, wherein the array of first conductive lines is disposed on the substrate in a first direction;
forming an array of isolation lines over the first conductive lines, wherein the array of isolation lines is disposed on the substrate in a second direction and is not disposed on the first pads, and wherein orientation of the second direction is different than the orientation of the first direction;

forming an array of second conductive lines with a plurality of second pads disposed on each of the second conductive lines, wherein the array of second conductive lines is disposed on the substrate in the second direction, and wherein each isolation line of the array of isolation lines bands only the geometry of a corresponding second conductive line of the array of second conductive lines; and printing one or more conductive ink dots at the intersection of selected first pads and selected second pads to electrically connect the corresponding first conductive lines and the second conductive lines to form a desired logic circuitry of the logic gate array.

2. The method of claim 1 wherein the first direction is vertical direction and the second direction is horizontal direction.

3. The method of claim 1 wherein the first direction is horizontal direction and the second direction is vertical direction.

4. The method of claim 1 wherein the first conductive lines are connected to logical gates and the second conductive lines are connected to electrical signals.

5. The method of claim 1 wherein the second conductive lines are connected to logical gates and the first conductive lines are connected to electrical signals.

6. The method of claim 1 wherein the conductive ink is deposited with inkjet printing.

7. The method of claim 1 wherein orientation of the first conductive lines is essentially perpendicular to orientation of the second conductive lines.

8. The method of claim 4 wherein the logical gates are selected from a group comprising AND, OR, NOT, NAND, NOR, XOR gates or a combinations thereof.

9. The method of claim 5 wherein the logical gates are selected from a group comprising AND, OR, NOT, NAND, NOR, XOR gates or a combinations thereof.

10. The method of claim 1 wherein the isolation lines are insulating material.

11. The method of claim 1 wherein the isolation lines are wider than the first conductive lines.

12. The method of claim 1 wherein the isolation lines are printed.

13. The method of claim 1 wherein the first and second conductive lines are printed.

* * * * *